(12) United States Patent
Russell et al.

(10) Patent No.: US 6,665,694 B1
(45) Date of Patent: Dec. 16, 2003

(54) SAMPLING RATE CONVERSION

(75) Inventors: Andrew I. Russell, Cambridge, MA (US); Paul E. Beckmann, Southborough, MA (US)

(73) Assignee: Bose Corporation, Framingham, MA (US)

(*) Notice: Subject to any disclaimer, the term of this patent is extended or adjusted under 35 U.S.C. 154(b) by 532 days.

(21) Appl. No.: 09/684,041

(22) Filed: Oct. 6, 2000

(51) Int. Cl.[7] .............................................. G06F 17/10
(52) U.S. Cl. ...................................................... 708/313
(58) Field of Search ......................................... 708/313

(56) References Cited

U.S. PATENT DOCUMENTS 6,134,569 A * 10/2000 Kot ................................ 708/3
6,182,101 B1 * 1/2001 Vahatalo et al. ............ 708/313
2002/0046227 A1 * 4/2002 Goszewski et al. ......... 708/313

OTHER PUBLICATIONS

Ramstad, Digital Methods for Conversion Between Arbitrary Sampling Frequencies IEE Transactions on Acoustics, Speech, and Signal Processing, Vo. ASSP–32, No. 3 Jun. 1984, 577–91.

* cited by examiner

Primary Examiner—David H. Malzahn
(74) Attorney, Agent, or Firm—Fish & Richardson P.C.

(57) ABSTRACT

An input signal having a first sampling rate is converted to an output signal having a second sampling rate. This is done by obtaining an intermediate sampling value from the input signal and filtering the intermediate sampling value to obtain the output signal. The intermediate sampling value corresponds to a sample taken at the second sampling rate on a continuous-time representation of the input signal.

43 Claims, 10 Drawing Sheets

SAMPLING RATE CONVERSION

CROSS-REFERENCE TO RELATED APPLICATIONS

Not Applicable

STATEMENT REGARDING FEDERALLY SPONSORED RESEARCH OR DEVELOPMENT

Not Applicable

REFERENCE TO A MICROFICHE APPENDIX

Not Applicable

BACKGROUND OF THE INVENTION

This invention relates to converting an input data stream having a first sampling rate to an output data stream having a second sampling rate.

Sampling rate conversion is performed when a discrete-time system needs to combine data streams with differing sampling rates. This is a common occurrence in audio and video applications. For example, audio sources may occur at different sampling rates, such as 44.1 kHz (kilohertz) for compact disks (CDs) and 48 kHz for digital audio tape (DAT).

One way of performing sampling rate conversion is to use a combination of up-sampling, filtering, and down-sampling. This can work if the ratio of the two sampling rates equals a rational number. In many cases, however, the two sampling rates are not related by a simple rational number. This occurs frequently when trying to synchronize data streams that are arriving from separate digital networks. For example, in audio applications, it is common to have a discrete-time system operating at 44.1 kHz while its input data stream is arriving at roughly 44.09 kHz with time variations. The receiving portion of the discrete-time system must adjust for these time variations during sampling rate conversion.

One way of performing sampling rate conversions on time-varying data streams uses finite impulse response (FIR) filters and linear weighted interpolation based on neighboring samples.

It is an important object to provide improved sampling rate conversion.

BRIEF SUMMARY OF THE INVENTION

In general, in one aspect, the invention is directed to converting an input signal having a first sampling rate to an output signal having a second sampling rate. The invention features obtaining an intermediate sampling value from the input signal and filtering the intermediate sampling value to obtain the output signal. The intermediate sampling value corresponds to a sample taken at the second sampling rate on a continuous-time representation of the input signal.

This aspect of the invention may include one or more of the following features. Obtaining the intermediate sampling value includes obtaining a coefficient that corresponds to the sample from the continuous-time representation of the input signal and determining the intermediate sampling value based on the coefficient and an impulse value. The impulse value corresponds to the input signal. The coefficient is a value of the continuous-time representation of the input signal taken at the sample. The coefficient is determined from a previous coefficient by multiplying the previous coefficient by a constant. The constant corresponds to a difference between the sample and a previous sample.

Filtering the intermediate sampling value includes adding the intermediate sampling value to a previous value that corresponds to a previous sample taken at the second sampling rate. Filtering is performed by a first order digital filter.

A second intermediate sampling value is obtained from the input signal and the second intermediate sampling value is filtered to obtain the output signal. The second intermediate sampling value corresponds to a second sample taken at the second sampling rate on the continuous-time representation of the input signal. In this case, filtering is performed using a second order digital filter.

One of the first and second sampling rates may be a compact disk sampling rate and the other of the first and second sampling rates may be a digital audio tape sampling rate. The continuous-time representation of the input signal may be a decaying exponential function or a sinusoidal function.

Other features, objects and advantages of the invention will become apparent from the following description and drawings.

DETAILED DESCRIPTION OF THE INVENTION

Figure 1A:
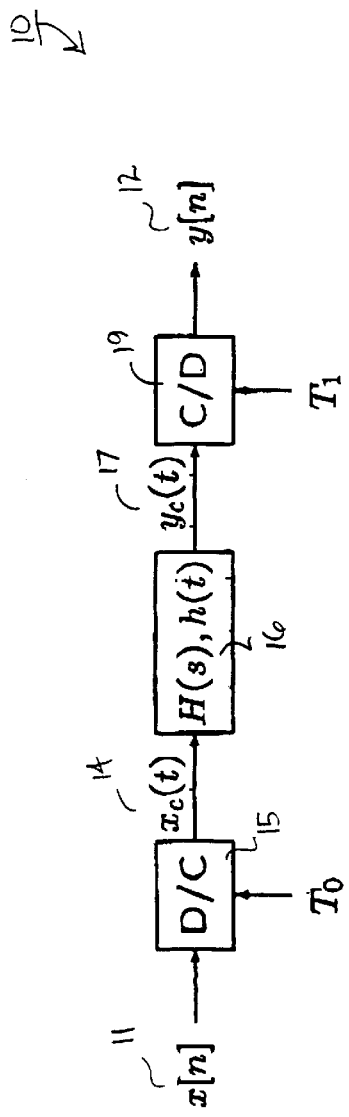
FIG. 1A is a system diagram of a prior art sampling rate conversion process.
Figure 1B:
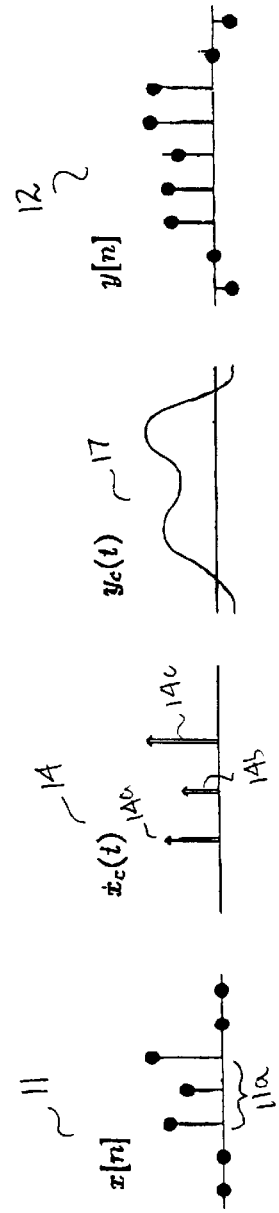
FIG. 1B shows graphs of the signals included in the system diagram of FIG. 1A.

With reference now to the drawings, FIGS. 1A and 1B show prior art sampling rate conversion process 10. In those figures, a digital signal x(n) 11 having a first sampling rate $T_0$ is converted to a digital signal y(n) 12 having a second sampling rate $T_1$. The conversion process 10 includes generating a time-based signal $x_c(t)$ 14 using discrete-to-continuous (D/C) converter 15, where $x_c(t)$ is:

$$x_c(t) = \sum_{k=-\infty}^{\infty} x[k]\delta(t - kT_0)$$

δ is the impulse function, and k is a sample.

The signal $x_c(t)$ comprises impulses 14a to 14c which occur at the same points as the data 11a in digital signal x(n). Filter H(s) 16 converts $x_c(t)$ to a continuous-time representation $y_c(t)$ 17 of x(n). In this example, filter 16 is a first order, low-pass filter with a cutoff frequency that is the smaller of $n/T_0$ and $n/T_1$ (the Nyquist rate). Continuous-to-discrete (C/D) converter 19 then samples $y_c(t)$ at rate $T_1$ to obtain digital signal y(n).

Figure 2A:
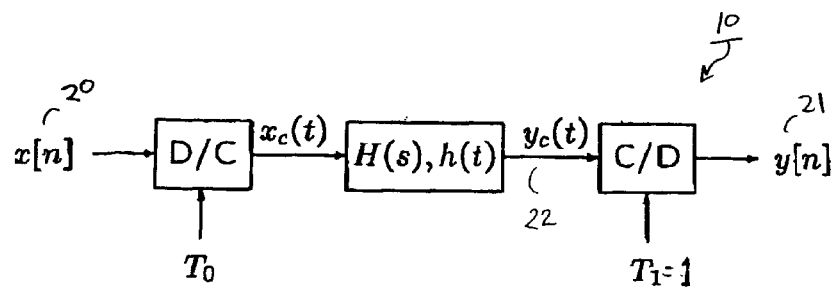
FIG. 2A is a system diagram of the prior art sampling rate conversion process.
Figure 2B:
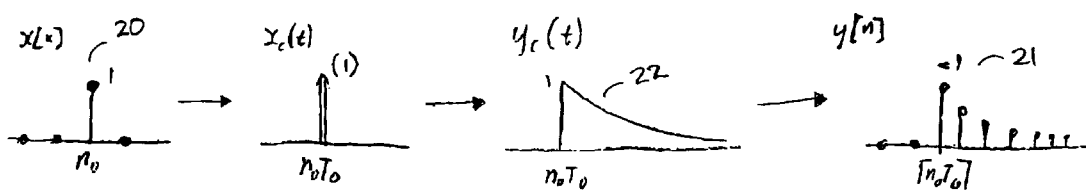
FIG. 2B shows graphs of the signals included in the system diagram of FIG. 2A.

FIGS. 2A and 2B show how a single data point 20 sampled at $T_0$ {x(n)} is converted to digital signal y(n) 21 sampled at $T_1$ using the system of FIG. 1A. The continuous-time representation $y_c(t)$ 22 for a single data point is a decaying exponential for a first order filter H(s). One or both of $T_0$ and $T_1$ may be time varying relative to the other. That is, $T_0$ and $T_1$ may be not related by a rational number.

Figure 2C:
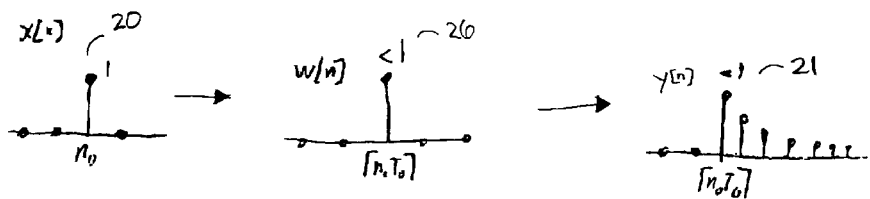
FIG. 2C shows an intermediate sampling value obtained from an input signal according to the invention.
Figure 3:
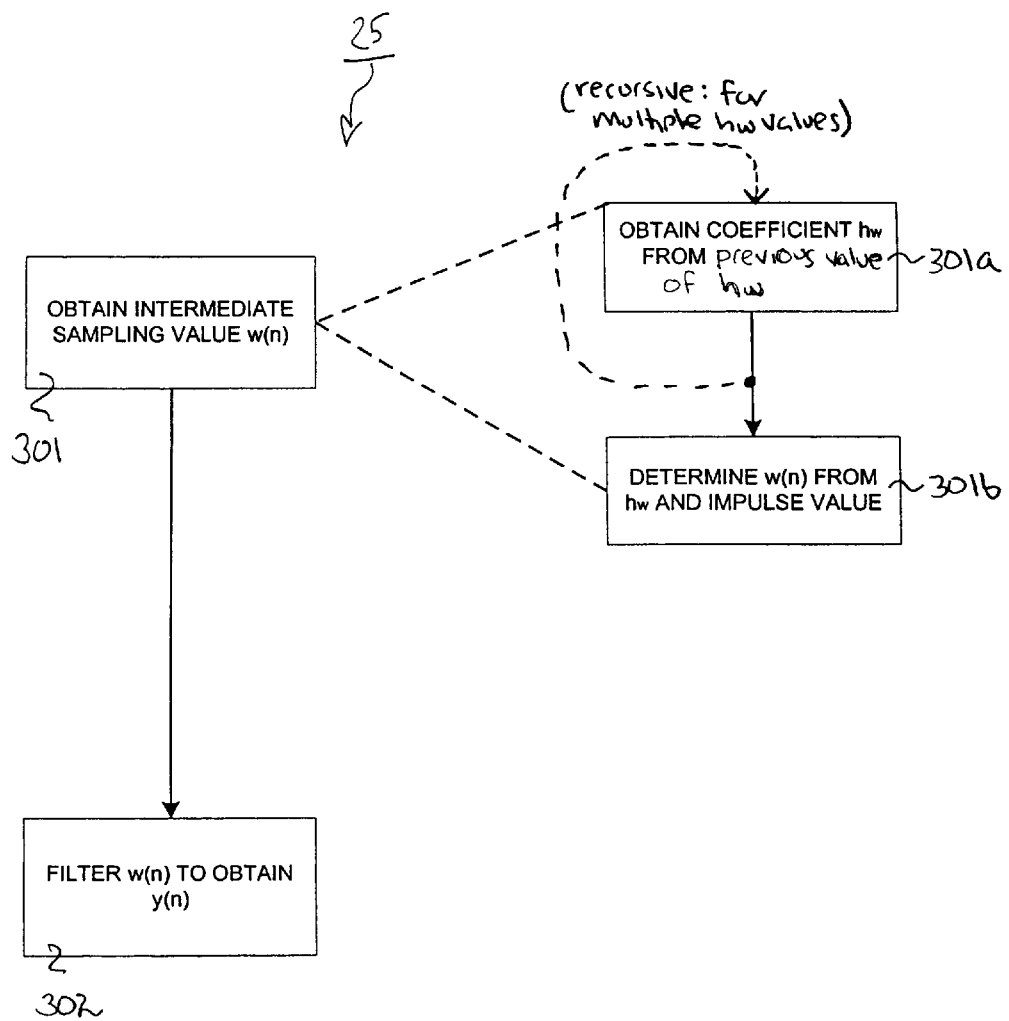
FIG. 3 is a flowchart showing the sampling rate conversion process that uses the intermediate sampling value according to the invention.

The sampling rate conversion process 25 according to the invention is shown in FIG. 3. Process 25 obtains (301) an intermediate sampling value w(n) 26 (FIG. 2C) from input digital signal x(n). Value w(n) corresponds to a sample taken at $T_1$ (the output rate). Value w(n) is then digitally filtered (302) to obtain y(n).

Figure 2D:
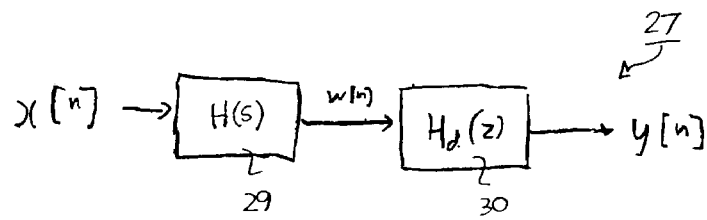
FIG. 2D is a system diagram of a sampling rate conversion process that uses the intermediate sampling value according to the invention.

A system diagram 27 for implementing process 25 is shown in FIG. 2D. In system diagram 27, block 29 includes transfer function H(s) for obtaining w(n) from x(n) and $H_d(z)$ 30, where $H_d(z)$ 30 is the filter used to obtain y(n). The following describes how to obtain w(n) from x(n) and then to obtain y(n) from w(n).

Assume that H(s) in block 29 is a first order filter with a system function of $$H(s) = \frac{1}{s+a}.$$

H(s) thus has a pole at s=−a and a zero at infinity. The impulse response, h(t), of a system with function H(s) is $$h(t) = e^{-at}u(t),$$

where u(t) is the unit step function defined by $$u(t) = 1 \text{ for } t \geq 0$$
$$= 0 \text{ otherwise.}$$

If "a" is real and positive then, by definition, the impulse response h(t) is real and the system is stable. Also assume that $T_1$=1. This does not restrict sampling rate conversion process 25, since any change in the sampling rate can be achieved by choosing an appropriate value for $T_0$.

Figure 4:
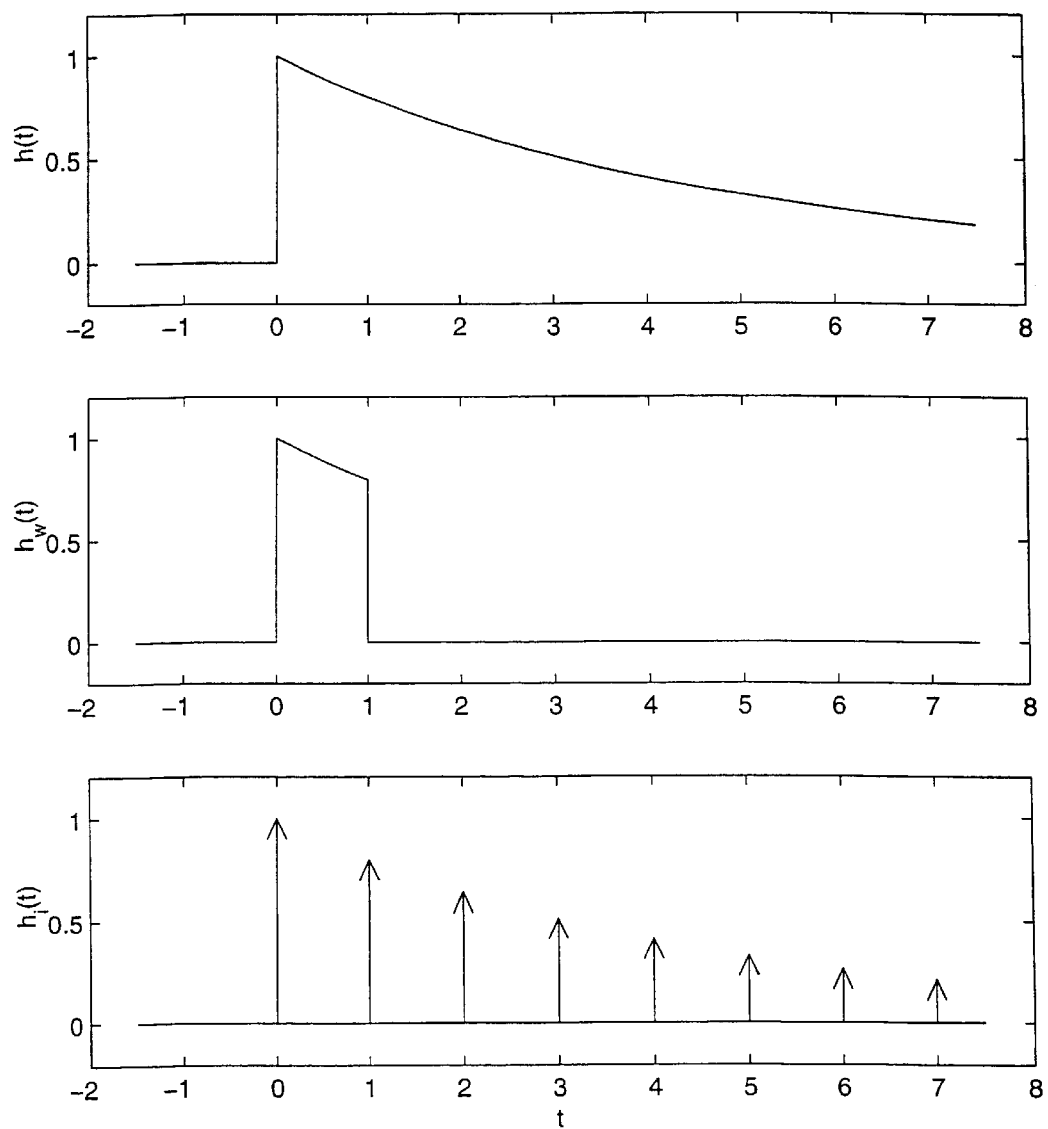
FIG. 4 shows the impulse response h(t) broken down into separate components $h_w(t)$ and $h_r(t)$.

The impulse response h(t) of system 27 (FIG. 4A) can be represented as a finite-duration or time-limited window $h_w(t)$ (FIG. 4B) convolved with a train of decaying impulses $h_i(t)$ (FIG. 4C). More specifically, $$h(t) = e^{-at}u(t)$$
$$= \alpha^t u(t)$$
$$= h_w(t) * h_i(t),$$

where $\alpha = e^{-a}$, $$h_w(t) = \alpha^t(u(t) - u(t-1))$$
$$= \alpha^t r(t),$$

and $$h_i(t) = \sum_{k=0}^{\infty} \alpha^k \delta(t-k)$$

Figure 5:
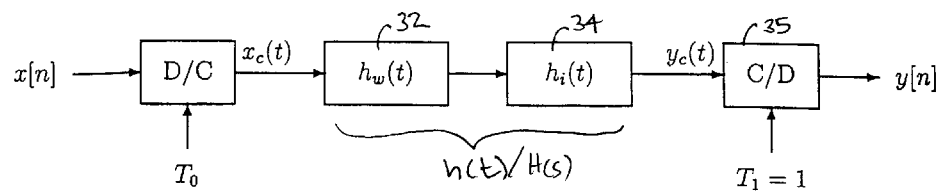
FIG. 5 is a system diagram of a sampling rate conversion process that includes the separate components $h_w(t)$ and $h_r(t)$.

The resulting system diagram 31 is shown in FIG. 5, in which H(s) from FIGS. 1A and 2A is replaced by $h_w(t)$ 32 and $h_i(t)$ 34.

Figure 6:
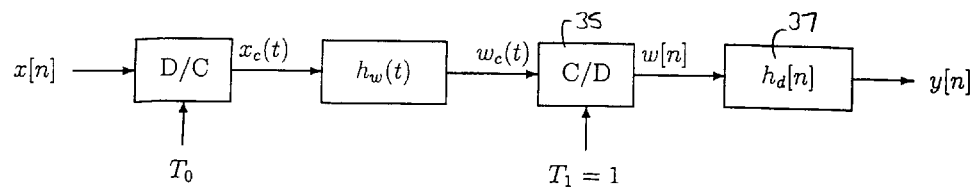
FIG. 6 a system diagram of a sampling rate conversion process that is derived from the system diagram of FIG. 5 and that includes the intermediate sampling value according to the invention.

If the sampling performed by C/D converter 35 and the impulses in $h_i(t)$ are both spaced by one second in time, C/D converter 35 and $h_i(t)$ 34 can be interchanged. The resulting system diagram 36 is shown in FIG. 6, in which $h_i(t)$ is replaced by its equivalent discrete time filter $h_d(n)$ 37, where $$h_d(n) = \alpha n_u(n).$$

The output of C/D converter 35 is the intermediate sampling value w(n). The value of w(n) may be determined as follows.

Figure 7:
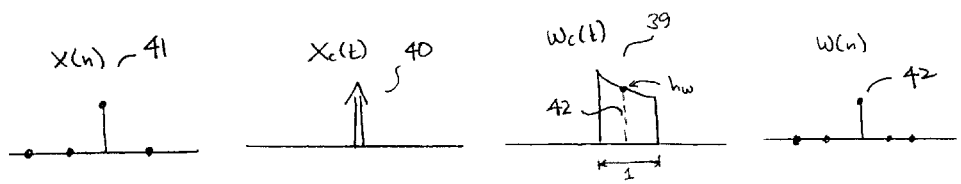
FIG. 7 shows signals present in the system of FIG. 6 when a first order digital filter is used.

Assuming that $x(n) = \delta(n-n_0)$ and $x_c(t) = \delta(t-n_0T_0)$, then $w_c(t) = h_w(t - n_0T_0)$, which starts at time $n_0T_0$ and has a duration of one second. FIG. 7 shows $w_c(t)$ 39 and $x_c(t)$ 40 for a given x(n) 41. The value for w(n) 42 is sampled from $w_c(t)$ at the second/output sampling rate. The function $w_c(t)$ is a continuous-time representation of the input signal x(n). For a first order filter, as in this example, $w_c(t)$ is a decaying exponential function that corresponds to x(n).

Figure 8:
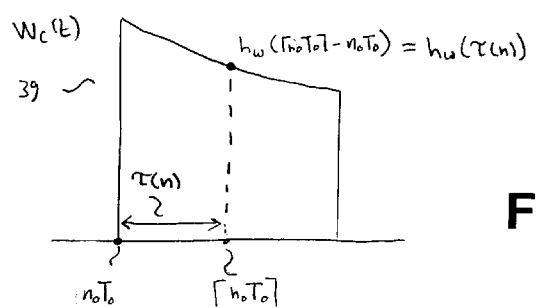
FIG. 8 is a close-up view of signal $w_c(t)$ from FIG. 7.
Figure 9A:
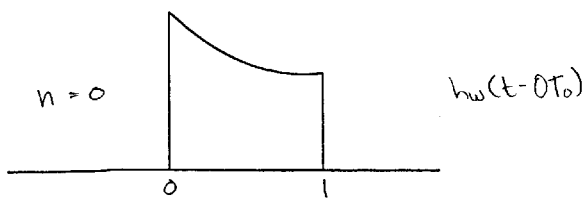
FIGS. 9A through 9F are graphs showing how $w_c(t)$ varies over time.
Figure 9B:
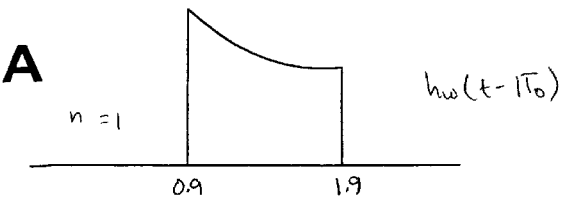
Figure 9C:
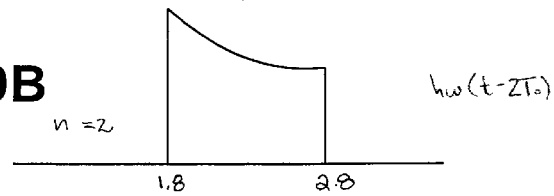
Figure 9D:
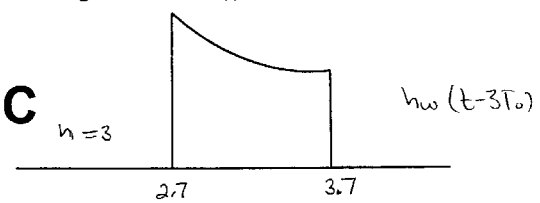
Figure 9E:
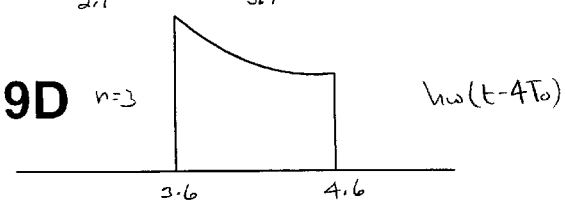
Figure 9F:
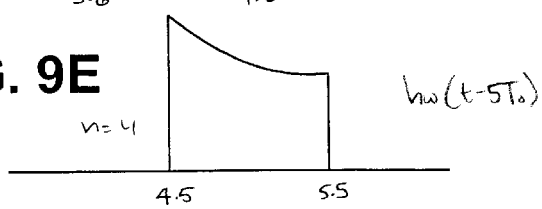

C/D converter 35 (FIG. 6) has a single nonzero output at a time $n = \lceil n_0T_0 \rceil$, where the notation "$\lceil n_0T_0 \rceil$" indicates the smallest integer value that is greater than or equal to $n_0T_0$. This is so because C/D converter 35 samples at integer time values only. The amplitude of the sample of w(n) will thus be $$h_w(\lceil n_0T_0 \rceil - n_0T_0),$$

as shown in FIG. 8 (which is a close-up view of $w_c(t)$ from FIG. 7). If the input x(n) is the impulse function $\delta(n-n_0)$, then the value of w(n) is $h_w$ multiplied by x(n), or $$w(n) = h_w(\lceil n_0T_0 \rceil - n_0T_0)\delta(n - \lceil n_0T_0 \rceil),$$

where $\delta(n - \lceil n_0T_0 \rceil)$ is the impulse function at time $\lceil n_0T_0 \rceil$. Defining τ(n) to be "$\lceil n_0T_0 \rceil - n_0T_0$" (see FIG. 8 for a graphical representation of τ(n)) makes $$w(n) = h_w(\tau(n_0))\delta(n - \lceil n_0T_0 \rceil).$$

To determine the response of the system to an input x(n), where x(n) contains multiple nonzero samples m, the equation is as follows $$\omega[n] = \sum_{m=-\infty}^{\infty} x[m]h_\omega(\tau[m])\delta[n - \lceil mT_0 \rceil]$$

Evaluating this sum may involve stepping through x(n) one sample at a time, multiplying the resulting value by the coefficient $h_w(\tau(n))$, and then adding the resulting product to the output. The coefficient $h_w(\tau(n))$ is obtained by sampling the continuous-time representation $h_w$ at $\tau(n)$ (see FIG. 8), as described below. The coefficient $h_w(\tau(n))$ corresponds to the sample $x(n)$, since $h_w$ is the continuous-time representation of $x(n)$.

To obtain $y(n)$ from $w(n)$, $w(n)$ is filtered using the digital filter $h_d(n)$ 37 (FIG. 6). As noted above, $$h_d(n) = \alpha^n u(n).$$

Taking the Z-transform of $h_d(n)$ yields $$H_d(z) = y(z)/w(z) = 1/(1-\alpha z^{-1}).$$

Rearranging the terms and taking the inverse Z transform of $H_d(z)$ leads to the difference equation $$y(n) = w(n) + \alpha y(n-1),$$

which defines the filter for obtaining $y(n)$ from $w(n)$.

The following describes determining the values of $h_w(\tau(n))$ that are used in determining $w(n)$.

The value of $\tau(n)$ changes as $h_w(t)$ changes for each $x(n)$. To determine how $\tau(n)$ changes over time, $\Delta(n)$ (or simply "$\Delta$") is defined to be $$\Delta(n) = \tau(n) - \tau(n-1).$$

Noting that $\tau(n) = \lceil n_0 T_0 \rceil - n_0 T_0$, results in the following $$\Delta[n] = \lceil nT_0 \rceil - nT_0 - \lceil (n-1)T_0 \rceil + (n-1)T_0$$

$$= \lceil nT_0 \rceil - \lceil nT_0 - T_0 \rceil - T_0$$

$$= \begin{cases} \lceil T_0 \rceil - T_0, & \tau[n-1] < T_0 - \lfloor T_0 \rfloor \\ \lfloor T_0 \rfloor - T_0, & \tau[n-1] \geq T_0 - \lfloor T_0 \rfloor \end{cases}$$

Thus, $\Delta(n)$ can take on two values: $\tau(n)$ either increases by a known quantity, corresponding to a positive value of $\Delta$, or $\tau(n)$ decreases by a known quantity, corresponding to a negative value of $\Delta$. So, $\tau(n)$ remains within the range of $$0 \leq \tau(n) < 1.$$

FIGS. 9A to 9F show shifted and scaled copies of $h_w(t)$. For sample $n=1$, $nT_0=0.9$ (FIG. 9B); for sample $n=2$, $nT_0=1.8$ (FIG. 9C); for sample $n=3$, $nT_0=2.7$ (FIG. 9D); and so on. The value of $\Delta$ in this example is either 0.1 or $-0.9$, depending on the sampling time. That is, for $nT_0=0.9$, $\lceil nT_0 \rceil$ is 1 and $\lceil nT_0 \rceil - nT_0$ (i.e., $\tau(n)$) is 0.1; for $nT_0=1.8$, $\lceil nT_0 \rceil$ is 2 and $\lceil nT_0 \rceil - nT_0$ is 0.2; for $nT_0=2.7$, $\lceil nT_0 \rceil$ is 3 and $\lceil nT_0 \rceil - nT_0$ is 0.3; and so on. The difference between a current value of $\lceil nT_0 \rceil - nT_0$ ($\tau(n)$) and a previous value of $\lceil nT_0 \rceil - nT_0$ ($\tau(n-1)$) is 0.1 ($\Delta$). Thus, in this example, the value of $\Delta$ increases by 0.1 as $h_w(t)$ changes over time. Alternatively, when $nT_0=8.1$, $\lceil nT_0 \rceil$ is 9, and $\lceil nT_0 \rceil - nT_0$ is 0.9. Following this progression leads to a $\Delta$ value of $-0.9$.

Knowing the value of $\Delta$, it is possible to determine $\tau(n)$ from $\tau(n-1)$ and, thus, to determine $h_w(\tau(n))$ from $h_w(\tau(n-1))$ and $\Delta$. More specifically, from above, $$h_w(\tau(n)) = \alpha^{\tau(n)}$$

$$= \alpha^{(\tau(n-1)+\Delta)}$$

$$= h_w(\tau(n-1))\alpha^\Delta.$$

Thus, at each sample, the new coefficient $h_w(\tau(n))$ can be calculated from the previous coefficient $h_w(\tau(n-1))$ in real-time by multiplying $h_w(\tau(n-1))$ by the constant $\alpha^\Delta$. The value of $\alpha^\Delta$ can be determined beforehand, stored in memory, and then retrieved for the multiplication. Using $\alpha^\Delta$ to update $h_w(\tau(n))$ eliminates the need to store a table of values for $h_w(\tau(n))$.

The foregoing describes sampling rate conversion using a first order digital filter $h_d(n)$. The invention, however, is not limited to use with first order filters. For example, a second order filter may be used. In the case of a second order filter, assume that the system function H(s) 29 in FIG. 2D has one complex conjugate pole pair, one zero on the real axis, and one zero at infinity. For such a system, $$h(t) = \gamma^t \sin(wt + \phi) u(t).$$

Representing the impulse response of the second order system as the convolution of a time limited portion $h_w(t)$ and an infinite train of impulses yields $$h(t) = \gamma^t \sin(\omega t + o) u(t)$$

$$= h_\omega(t) \times h_i(t).$$

where $$h_r(t) = \gamma^t \{\sin(wt - \phi)\tau(t) - \sin(w(t-2) + \phi)\tau(t-1)\}.$$

and $$h_i(t) = \sum_{k=0}^{\infty} \gamma^k \frac{\sin(\omega(k+1))}{\sin\omega} \delta(t-k).$$

As above, interchanging the filtering and sampling operations yields the system shown in FIG. 6, where $$h_d[n] = \gamma^n \frac{\sin(\omega(n+1))}{\sin\omega} u[n].$$

Figure 10:
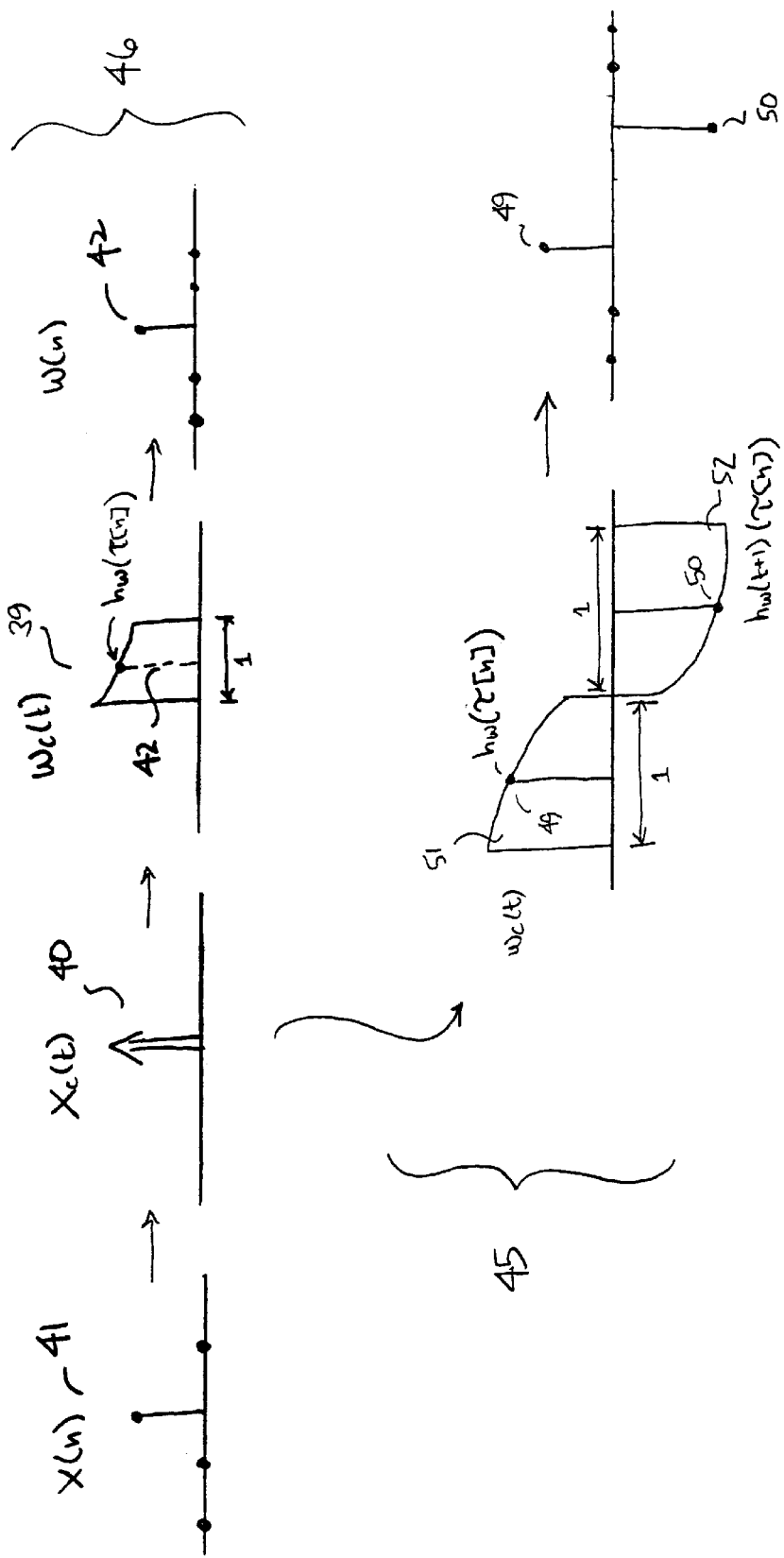
FIG. 10 shows signals present in the system of FIG. 6 when a second order digital filter is used.

When $x(n) = \delta(n - n_0)$, $w_c(t)$ has a time-width of two seconds for the second order case. This is shown in FIG. 10, which shows the second order case 45 in relation to the first order case 46 from FIG. 7. As shown, in the second order case 45, $w_c(t)$ is a portion (time-limited window) of a sinusoidal function and the two samples 49 and 50 are taken in respective phases 51 and 52 of that sinusoidal function to obtain $w(n)$.

The first of the samples 49 occurs at $t = \lceil n_0 T_0 \rceil$ and the second of these samples 50 occurs at $t = \lceil n_0 T_0 \rceil + 1$. The amplitude of first sample 49 is $h_w(\tau(n_0))$ and the amplitude of second sample 50 is $h_w(\tau(n_0)+1)$. So, for an input of $x(n) = \delta(n - n_0)$, $$w(n) = h_w(\tau(n_0))\delta(n - \lceil n_0 T_0 \rceil) + h_w(\tau(n_0)+1)\delta(n - \lceil n_0 T_0 \rceil - 1),$$

This is analogous to the equation for $w(n)$ described for first order filters above. For an arbitrary input $x(m)$, the intermediate sampling value $w(n)$ is as follows $$\omega[n] = \sum_{m=-\infty}^{\infty} x[m]\{h_\omega, \tau[m]\}\delta[n - \lceil mT_0 \rceil] + h_\omega(\tau[m]-1)\delta[n - \lceil mT_0 \rceil - 1]\}$$

The equations for determining the first coefficient $h_w(\tau(n))$ and the second coefficient $h_w(\tau(n)+1)$ are as follows:

$$h_w(\tau[n]) = A \cdot h_w(\tau[n-1]) + B \cdot h_w(\tau[n-1]+1)$$

$$h_w(\tau[n]+1) = C \cdot h_w(\tau[n-1]) + D \cdot h_w(\tau[n-1]+1),$$

where $$A = \gamma^\Delta(\cos\Delta\omega + \sin\Delta\omega\cot\omega)$$

$$B = \gamma^{(\Delta-1)}\sin\frac{\Delta\omega}{\sin\omega}$$

$$C = -\gamma^{(\Delta-1)}\sin\frac{\Delta\omega}{\sin\omega}$$

$$D = \gamma^\Delta(\cos\Delta\omega - \sin\Delta\omega\cot\omega)$$

In the foregoing equations, $\Delta$ is as described above and $\gamma$ and $\omega$ are known second order filter properties.

As above, the constants A, B, C and D can be determined beforehand, stored in memory, and retrieved when it comes time to perform the necessary multiplication. For each sample, new coefficients $h_w(\tau(n))$ and $h_w(\tau(n)+1)$ are determined in real-time from the old coefficients $h_w(\tau(n-1))$ and $h_w(\tau(n-1)+1)$ using only four multiplication operations, i.e., by A, B, C and D. Since there are two possible values for $\Delta$ (as above), two different version of A, B, C and D should be determined, stored, and applied as appropriate.

To obtain the digital filter $h_d(n)$ for the second order case, we take the Z transform of $$h_d[n] = \gamma^n \frac{\sin(\omega(n+1))}{\sin\omega} u[n]$$

to obtain $$H_d(z) = \frac{1}{1-(2\gamma\cos\omega)z^{-1}+\gamma^2 z^{-2}}$$

Rearranging the terms and taking the inverse Z transform of $H_d(Z)$ leads to the difference equation $$y=[n]=w[n]+(2\gamma\cos w)y[n-1]-\gamma^2 y[n-2].$$

This involves only two multiplication operations per sample to obtain y(n) from w(n).

The invention can be used with higher order filters as well. For example, assume that H(s) has N (N>2) poles and N−1 zeros in the finite s-plane. A partial fraction expansion can be performed on H(s) to break down H(s) into the sum of several first and/or second order pieces, each of which can be solved as described above. Each of these pieces can be implemented in parallel and the results added together to find a solution to the Nth order case. To implement the Nth order case, the impulse response of the system is defined as $$h(t) = \sum_{i=1}^{N_p} \beta_i \alpha_i^t u(t) + \sum_{i=1}^{N_p} \theta_i \gamma_i^t \sin(\omega_i t + o_i) u(t),$$

where $N_r$ is the number of real poles and $N_p$ is the number of complex conjugate pole pairs. A similar process may be used for the case where H(s) has repeated poles.

To summarize, the sampling rate conversion process for a given H(s) having $N_r$ real poles and $N_p$ pairs of complex conjugate poles (for a total N poles) is as set forth in FIG. 3. That is, each of the intermediate sampling values w(n) are obtained (301) by obtaining (301a) the coefficients, $h_w$, that are needed from the continuous-time representation of the input signal. For N (N≧1) total poles, N such coefficients will be needed. Values for w(n) are determined (301b) by stepping through the input samples one at a time and, at each step (i) multiplying the value of the sample by the coefficients $h_w$ and adding the results to w(n), and (ii) updating the coefficients $h_w$ in preparation for the next iteration. After values for w(n) have been obtained, w(n) is filtered (302) using an appropriate filter and the results of the filtering summed to obtain output y(n).

The following describes process 25 as performed on two digital audio streams that are to be combined and output through the same DAC (digital-to-analog converter). Each input is a two-channel audio stream. However, one of the inputs is arriving at 44.1 kHz and the other is arriving at 44.09794 kHz. Process 25 is used to up-sample the second input by a fraction $T_0$=0.9995328.

Figure 11:
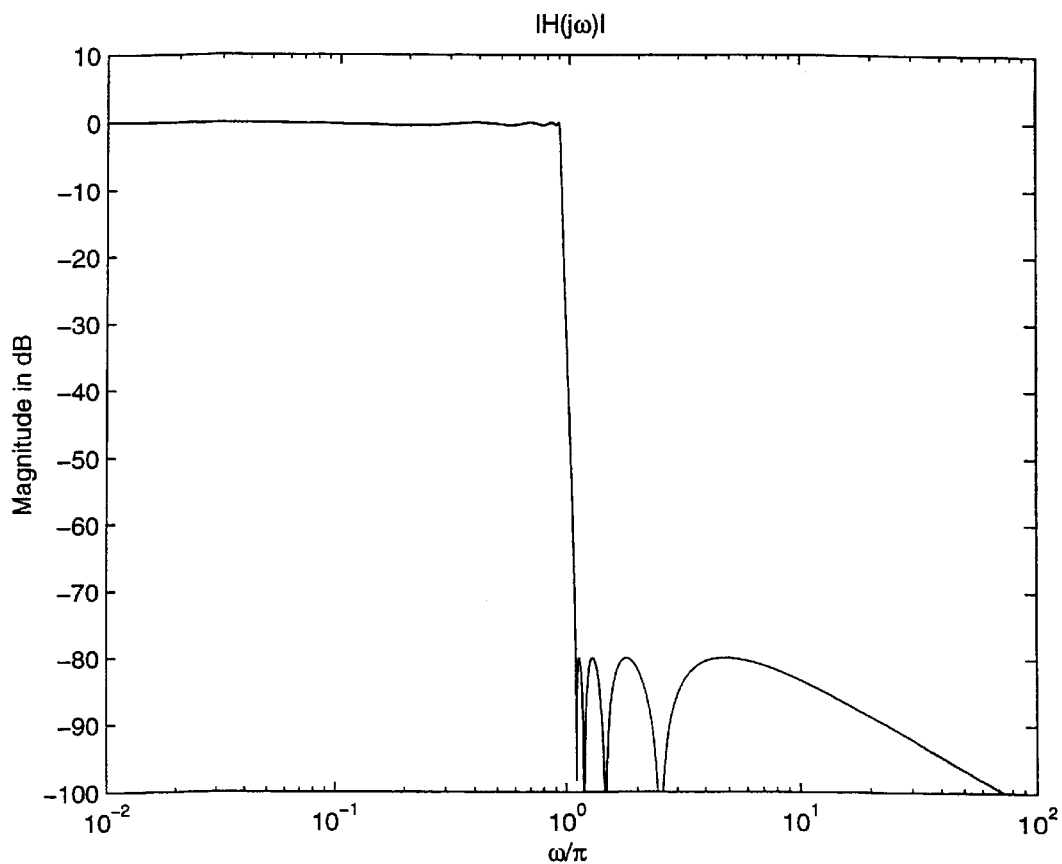
FIG. 11 is a graph showing a $9^{th}$ order filter.
Figure 12:
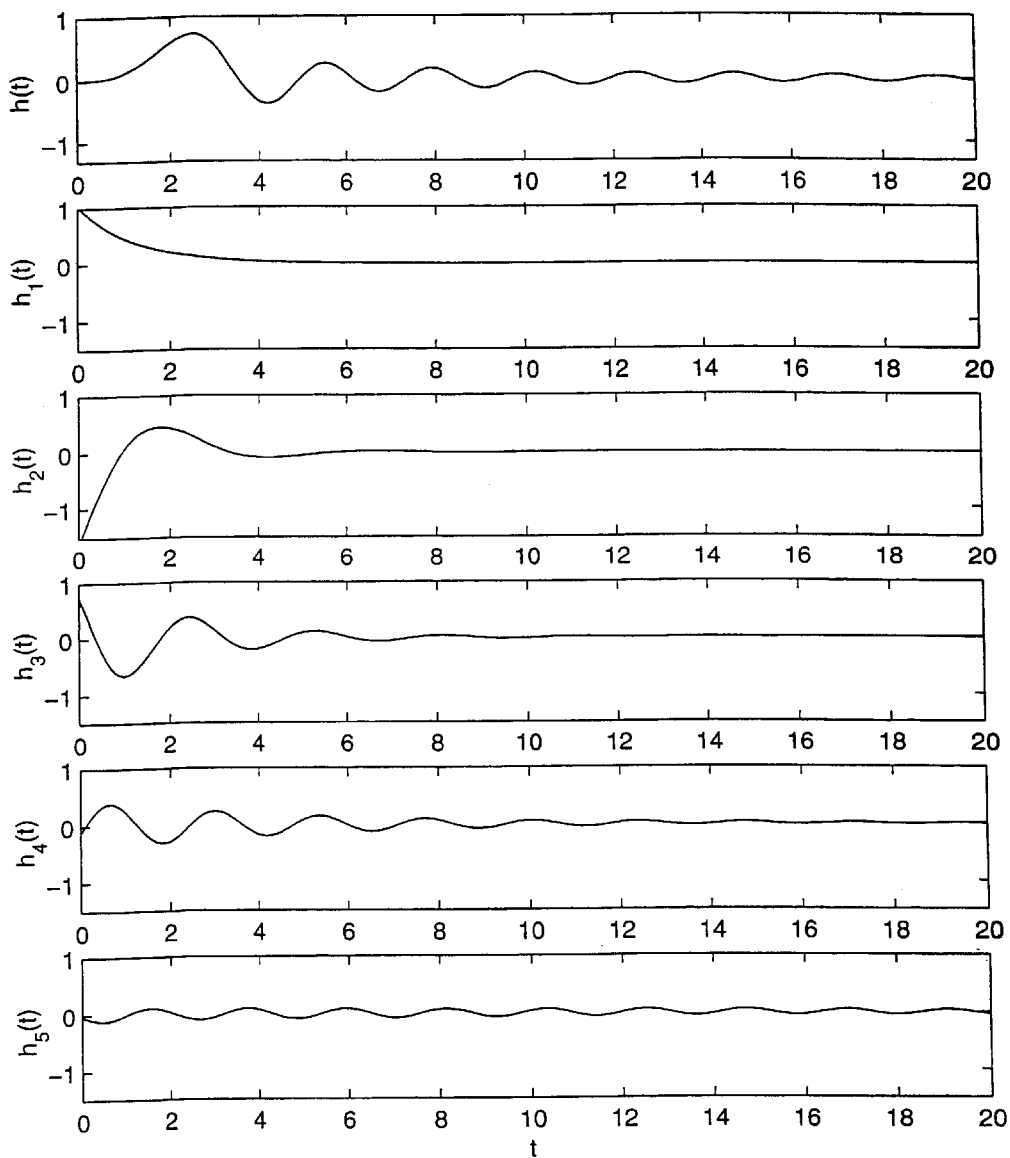
FIG. 12 includes graphs showing the impulse response, h(t), of the $9^{th}$ order filter and the individual partial fraction expansion components of the impulse response.

To do this, H(s) is chosen to be an elliptic filter with a passband edge frequency of $2\pi(20 \text{ kHz}/44.1 \text{ kHz})$ radians per second and a stopband edge frequency of $2\pi(24.1 \text{ kHz}/44.1 \text{ kHz})$ radians per second. The passband is allowed ±0.2 dB (decibels) of ripple and the stopband is allowed at least 80 dB of attenuation. To match these specifications, a $9^{th}$ order elliptic filter having the response shown in FIG. 11 is used. The impulse response h(t) and its individual partial fraction components $h_1(t)$ to $h_5(t)$ are shown in FIG. 12.

For generating the values of w(n), process 25 performs one multiplication operation per sample for the real pole. Process 25 performs two multiplication operations for each of the four-pole pairs. These are performed twice because there are two channels. Thus, a total of eighteen multiplication operations are performed for every sample to generate values of w(n). To update the $h_w$ coefficients, one multiplication operation is performed for the real pole and four multiplication operations are performed for each of the pole pairs, for a total of seventeen multiplication operations. To filter the values of w(n) to obtain the output y(n), nine multiplication operations are performed for each of the two channels, adding a total of eighteen more multiplication operations. Thus, process 25 performs a total of 53 multiplication operations. In real time, these multiplication operations are performed for every sample, i.e., 44,100 times per second, for a total of 2.34 million multiplication operations per second.

In a standard FIR sampling conversion technique, a time-varying impulse response having a length of twenty-seven is required (thirty-one if it is a linear phase). So, twenty-seven multiplication operations per channel are needed. This leads to about 2.38 million multiplication operations per second, which is comparable to the number of multiplication operations required by process 25. The difference, however, is that the FIR technique requires a large table of impulse responses/coefficients to be stored. Such a table is on the order of seven thousand points. For process 25, only about fifty-two values (e.g., $\Delta$, A, B, C and D above) are stored. Thus, relatively little memory is needed to perform the sampling rate conversion process of the invention.

Figure 13:
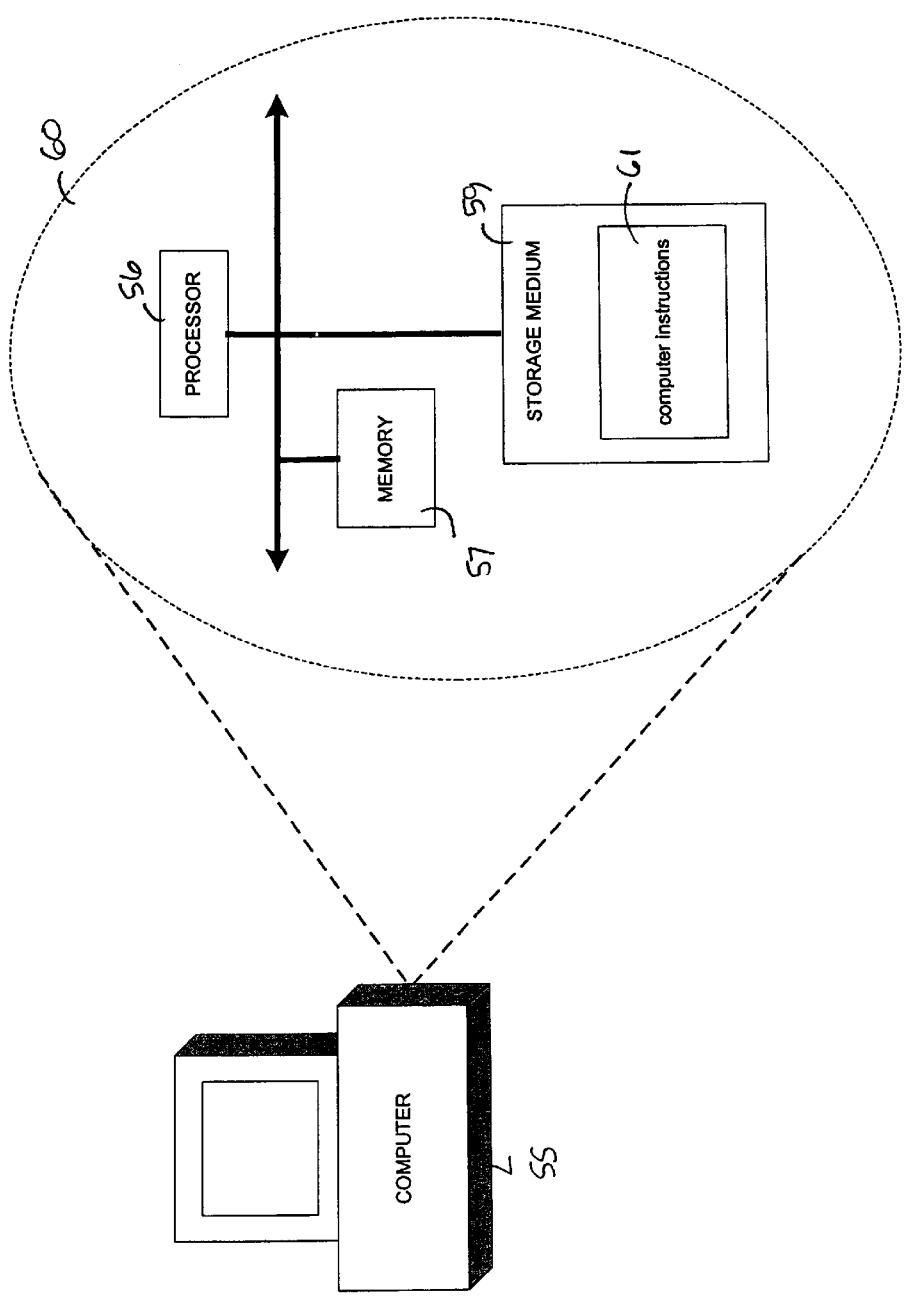
FIG. 13 is a block diagram of a system implementing the process of FIG. 3 according to the invention.

FIG. 13 shows a device 55 (e.g., a computer) for performing sampling rate conversion process 25. Device 55 includes a processor 56, a memory 57, and a storage medium 59, e.g., a hard disk (see view 60). Storage medium 59 stores computer-executable instructions 61 for performing process 25. Processor 56 executes computer-executable instructions 61 out of memory 57 to perform process 25.

Process 25, however, is not limited to use with the hardware/software configuration of FIG. 13; it may find applicability in any computing or processing environment. Process 25 may be implemented in hardware, software, or a combination of the two (e.g., using an ASIC (application-specific integrated circuit) or programmable logic). Process 25 may be implemented in one or more computer programs executing on programmable computers that each includes a processor, a storage medium readable by the processor (including volatile and non-volatile memory and/or storage elements), at least one input device, and one or more output devices. Program code may be applied to data entered using an input device to perform process 25 and to generate output information. The output information may be applied to one or more output devices.

Each such program may be implemented in a high level procedural or object-oriented programming language to communicate with a computer system. However, the programs can be implemented in assembly or machine language. The language may be a compiled or an interpreted language.

Each computer program may be stored on a storage medium or device (e.g., CD-ROM, hard disk, or magnetic diskette) that is readable by a general or special purpose programmable computer for configuring and operating the computer when the storage medium or device is read by the computer to perform process 25. Process 25 may also be implemented as a computer-readable storage medium, configured with a computer program, where, upon execution, instructions in the computer program cause the computer to operate in accordance with process 25.

Other embodiments not described herein are also within the scope of the following claims. For example, an input signal whose sampling rate is to be converted may be partitioned into blocks. After each block, new $h_w$ coefficients are determined. This block-based approach permits changing of the sampling rate $T_0$ for each block. The invention can be used to mix digital signals from any asynchronous sources in real-time, not just digital audio.

Representative Matlab code for performing sampling rate conversion in accordance with process 25 using an $N^{th}$ (N>1) order filter is shown in the attached Appendix.

What is claimed is:

1. A method of converting an input signal having a first sampling rate to an output signal having a second sampling rate, comprising:
   obtaining an intermediate sampling value from the input signal, the intermediate sampling value corresponding to a sample taken at the second sampling rate on a continuous-time representation of the input signal; and
   filtering the intermediate sampling value to obtain the output signal.

2. The method of claim 1, wherein obtaining the intermediate sampling value comprises:
   obtaining a coefficient from the continuous-time representation of the input signal, the coefficient corresponding to the sample; and
   determining the intermediate sampling value based on the coefficient and an impulse value.

3. The method of claim 2, wherein the impulse value corresponds to the input signal.

4. The method of claim 2, wherein the coefficient comprises a value of the continuous-time representation of the input signal taken at the sample.

5. The method of claim 4, wherein the coefficient is determined from a previous coefficient by multiplying the previous coefficient by a constant.

6. The method of claim 5, wherein the constant corresponds to a difference between the sample and a previous sample.

7. The method of claim 1, wherein filtering comprises adding the intermediate sampling value to a previous value that corresponds to a previous sample taken at the second sampling rate.

8. The method of claim 1, wherein filtering is performed by a first order digital filter.

9. The method of claim 1, further comprising:
   obtaining a second intermediate sampling value from the input signal, the second intermediate sampling value corresponding to a second sample taken at the second sampling rate on the continuous-time representation of the input signal; and
   filtering the second intermediate sampling value to obtain the output signal.

10. The method of claim 9, wherein filtering is performed using a second order digital filter.

11. The method of claim 1, wherein one of the first and second sampling rates comprises a compact disk sampling rate and the other of the first and second sampling rates comprises a digital audio tape sampling rate.

12. The method of claim 1, wherein the continuous-time representation of the input signal comprises a decaying exponential function.

13. The method of claim 1, wherein the continuous-time representation of the input signal comprises a sinusoidal function.

14. The method of claim 1, wherein one of the first and second sampling rates is time-varying.

15. A computer program stored on a computer-readable medium for converting an input signal having a first sampling rate to an output signal having a second sampling rate, the computer program comprising executable instructions that cause a computer to:
   obtain an intermediate sampling value from the input signal, the intermediate sampling value corresponding to a sample taken at the second sampling rate on a continuous-time representation of the input signal; and
   filter the intermediate sampling value to obtain the output signal.

16. The computer program of claim 15, wherein obtaining the intermediate sampling value comprises:
   obtaining a coefficient from the continuous-time representation of the input signal, the coefficient corresponding to the sample; and
   determining the intermediate sampling value based on the coefficient and an impulse value.

17. The computer program of claim 16, wherein the impulse value corresponds to the input signal.

18. The computer program of claim 16, wherein the coefficient comprises a value of the continuous-time representation of the input signal taken at the sample.

19. The computer program of claim 18, wherein the coefficient is determined from a previous coefficient by multiplying the previous coefficient by a constant.

20. The computer program of claim 19, wherein the constant corresponds to a difference between the sample and a previous sample.

21. The computer program of claim 15, wherein filtering comprises adding the intermediate sampling value to a previous value that corresponds to a previous sample taken at the second sampling rate.

22. The computer program of claim 15, wherein filtering is performed by a first order digital filter.

23. The computer program of claim 15, further comprising instructions that cause the computer to:
   obtain a second intermediate sampling value from the input signal, the second intermediate sampling value corresponding to a second sample taken at the second sampling rate on the continuous-time representation of the input signal; and filter the second intermediate sampling value to obtain the output signal.

24. The computer program of claim 23, wherein filtering is performed using a second order digital filter.

25. The computer program of claim 15, wherein one of the first and second sampling rates comprises a compact disk sampling rate and the other of the first and second sampling rates comprises a digital audio tape sampling rate.

26. The computer program of claim 15, wherein the continuous-time representation of the input signal comprises a decaying exponential function.

27. The computer program of claim 15, wherein the continuous-time representation of the input signal comprises a sinusoidal function.

28. The computer program of claim 15, wherein one of the first and second sampling rates is time-varying.

29. An apparatus for converting an input signal having a first sampling rate to an output signal having a second sampling rate, that apparatus comprising circuitry which:

obtains an intermediate sampling value from the input signal, the intermediate sampling value corresponding to a sample taken at the second sampling rate on a continuous-time representation of the input signal; and filters the intermediate sampling value to obtain the output signal.

30. The apparatus of claim 29, wherein obtaining the intermediate sampling value comprises:

obtaining a coefficient from the continuous-time representation of the input signal, the coefficient corresponding to the sample; and determining the intermediate sampling value based on the coefficient and an impulse value.

31. The apparatus of claim 30, wherein the impulse value corresponds to the input signal.

32. The apparatus of claim 29, wherein the coefficient comprises a value of the continuous-time representation of the input signal taken at the sample.

33. The apparatus of claim 32, wherein the coefficient is determined from a previous coefficient by multiplying the previous coefficient by a constant.

34. The apparatus of claim 33, wherein the constant corresponds to a difference between the sample and a previous sample.

35. The apparatus of claim 29, wherein filtering comprises adding the intermediate sampling value to a previous value that corresponds to a previous sample taken at the second sampling rate.

36. The apparatus of claim 29, wherein filtering is performed by a first order digital filter.

37. The apparatus of claim 29, further comprising circuitry which:

obtains a second intermediate sampling value from the input signal, the second intermediate sampling value corresponding to a second sample taken at the second sampling rate on the continuous-time representation of the input signal; and filters the second intermediate sampling value to obtain the output signal.

38. The apparatus of claim 37, wherein filtering is performed using a second order digital filter.

39. The apparatus of claim 29, wherein one of the first and second sampling rates comprises a compact disk sampling rate and the other of the first and second sampling rates comprises a digital audio tape sampling rate.

40. The apparatus of claim 29, wherein the continuous-time representation of the input signal comprises a decaying exponential function.

41. The apparatus of claim 29, wherein the continuous-time representation of the input signal comprises a sinusoidal function.

42. The apparatus of claim 29, wherein one of the first and second sampling rates is time-varying.

43. An apparatus for converting an input signal having a first sampling rate to an output signal having a second sampling rate, comprising:

means for obtaining an intermediate sampling value from the input signal, the intermediate sampling value corresponding to a sample taken at the second sampling rate on a continuous-time representation of the input signal; and means for filtering the intermediate sampling value to obtain the output signal.

\* \* \* \* \*